(12) United States Patent
Yu et al.

(10) Patent No.: US 11,329,111 B2
(45) Date of Patent: May 10, 2022

(54) FLEXIBLE SUBSTRATE, MANUFACTURING METHOD THEREOF, AND DISPLAY PANEL HAVING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhaowei Yu, Beijing (CN); Chao Kong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 51 days.

(21) Appl. No.: 16/959,337

(22) PCT Filed: Feb. 10, 2020

(86) PCT No.: PCT/CN2020/074589
§ 371 (c)(1),
(2) Date: Jun. 30, 2020

(87) PCT Pub. No.: WO2020/233173
PCT Pub. Date: Nov. 26, 2020

(65) Prior Publication Data
US 2021/0143234 A1 May 13, 2021

(30) Foreign Application Priority Data
May 22, 2019 (CN) .......................... 201910431442.4

(51) Int. Cl.
*H01L 27/32* (2006.01)
*H01L 27/12* (2006.01)
(Continued)

(52) U.S. Cl.
CPC ...... *H01L 27/3244* (2013.01); *H01L 27/1218* (2013.01); *H01L 51/0097* (2013.01); *H01L 51/5237* (2013.01); *H01L 51/56* (2013.01)

(58) Field of Classification Search
None
See application file for complete search history.

(56) References Cited

U.S. PATENT DOCUMENTS

2005/0269926 A1 12/2005 Fukuoka et al.
2011/0132449 A1 6/2011 Ramadas
(Continued)

FOREIGN PATENT DOCUMENTS

CN  1703123 A  11/2005
CN  102057750 A  5/2011
(Continued)

OTHER PUBLICATIONS

Office Action dated Feb. 21, 2020 in Chinese Application No. 201910431442.4 (13 pages).
(Continued)

*Primary Examiner* — J. E. Schoenholtz
(74) *Attorney, Agent, or Firm* — Muncy, Geissler, Olds & Lowe, P.C.

(57) ABSTRACT

The present disclosure provides a flexible substrate, its manufacturing method and a display panel. The flexible substrate includes a base substrate, and an organic thin film, an inorganic thin film and a function layer laminated on the base substrate. A first water-and-oxygen absorption adhesive layer is arranged between the organic thin film and the inorganic thin film and adhered to the organic thin film and the inorganic thin film respectively.

17 Claims, 3 Drawing Sheets

(51) Int. Cl.
  *H01L 51/00*  (2006.01)
  *H01L 51/52*  (2006.01)
  *H01L 51/56*  (2006.01)

(56) References Cited

U.S. PATENT DOCUMENTS

| | | | |
|---|---|---|---|
| 2011/0175102 A1* | 7/2011 | Hatano | H01L 51/5243 257/72 |
| 2014/0306260 A1 | 10/2014 | Yamazaki et al. | |
| 2017/0271623 A1 | 9/2017 | Wang et al. | |
| 2020/0083487 A1* | 3/2020 | Jin | H01L 51/502 |
| 2020/0321411 A1* | 10/2020 | Xia | H01L 51/5253 |
| 2021/0013449 A1* | 1/2021 | Sakamoto | H05B 33/10 |

FOREIGN PATENT DOCUMENTS

| | | |
|---|---|---|
| CN | 102169964 A | 8/2011 |
| CN | 105144841 A | 12/2015 |
| CN | 105237693 A | 1/2016 |
| CN | 106684256 A | 5/2017 |
| CN | 107394058 A | 11/2017 |
| CN | 108321172 A | 7/2018 |
| CN | 108493355 A | 9/2018 |
| CN | 208781892 U | 4/2019 |
| CN | 109786573 A | 5/2019 |
| CN | 110112315 A | 8/2019 |
| WO | WO-2005/051525 A1 | 6/2005 |

OTHER PUBLICATIONS

Office Action dated Aug. 6, 2020 in Chinese Application No. 201910431442.4 (13 pages).
International Search report dated May 7, 2020 in PCT/CN2020/074589 (16 pages).
An Office Action dated Feb. 21, 2020 in Chinese Application No. 201910431442.4 is attached (13 pages).
An Office Action dated Aug. 6, 2020 in Chinese Application No. 201910431442.4 is attached (13 pages).
An International Search Report dated May 7, 2020 in PCT/CN2020/074589 is attached (16 pages).

* cited by examiner

FLEXIBLE SUBSTRATE, MANUFACTURING METHOD THEREOF, AND DISPLAY PANEL HAVING THE SAME

CROSS-REFERENCE TO RELATED APPLICATIONS

The present application is the U.S. national phase of PCT Application No. PCT/CN2020/074589 filed on Feb. 10, 2020, which claims a priority of the Chinese patent application 201910431442.4 filed on May 22, 2019, which are incorporated herein by reference in their entirety.

TECHNICAL FIELD

The present disclosure relates to the field of display technology, in particular to a flexible substrate, its manufacturing method and a display panel.

BACKGROUND

Organic Light-Emitting Diode (OLED) has been considered as a next-generation display technology for replacing a liquid crystal technology due to its inherent advantages such as self-luminescence, high brightness, rapid response, wide gamut, and being applicable to a flexible display device. The OLED consists of a cathode, an anode and an organic material arranged between the cathode and the anode, so various display defects may occur for the OLED due to the existence of water, oxygen or dust, and thereby a display result and an optical service life of the OLED may be adversely affected. In order to prevent elements/members/parts from being adversely affected by the water and oxygen, currently organic thin films and inorganic thin films are arranged alternately. However, an inorganic material has such characteristics as low surface energy, low surface tension and low solubility. In addition, usually the inorganic material is fragile, and when it is used together with an organic material, cracks may easily occur in an inorganic layer. Furthermore, there is a small adhesion between the inorganic material and the organic material, and a clearance may easily occur between the inorganic layer and an organic layer, so the water and oxygen may permeate the OLED, and thereby the optical performance and the optical service life of the OLED may be adversely affected.

SUMMARY

In one aspect, the present disclosure provides in some embodiments a flexible substrate, including: a base substrate; an organic thin film, an inorganic thin film and a function layer laminated on the base substrate; and a first water-and-oxygen absorption adhesive layer arranged between the organic thin film and the inorganic thin film and adhered to the organic thin film and the inorganic thin film respectively.

In some possible embodiments of the present disclosure, the function layer includes a thin film transistor (TFT) layer and a planarization layer laminated one on another, and a second water-and-oxygen absorption adhesive layer is arranged between the TFT layer and the planarization layer.

In some possible embodiments of the present disclosure, the first water-and-oxygen absorption adhesive layer includes water-and-oxygen absorption material members and adhesive members arranged alternately in a direction perpendicular to a lamination direction.

In some possible embodiments of the present disclosure, the second water-and-oxygen absorption adhesive layer includes water-and-oxygen absorption material members and adhesive members arranged alternately in a direction perpendicular to a lamination direction.

In some possible embodiments of the present disclosure, a ratio of a space occupied by the water-and-oxygen absorption material members to a space occupied by the adhesive members is 2:1.

In some possible embodiments of the present disclosure, each water-and-oxygen absorption material member is made of a water-and-oxygen absorption material, and the water-and-oxygen absorption material is acquired through hybridization of an inorganic-organic composite.

In some possible embodiments of the present disclosure, each adhesive member is made of an adhesive, and the adhesive is made of a polymer-based inorganic nanocomposite or an organic silicone resin.

In some possible embodiments of the present disclosure, the water-and-oxygen absorption material includes one or more of an acrylic resin hybridized with silicon dioxide, 1,4-butenediol hybridized with silicon dioxide, cis-butenedioic anhydride hybridized with silicon dioxide, and hydroxyl-terminated polybutadiene hybridized with silicon dioxide.

In some possible embodiments of the present disclosure, the polymer-based inorganic nanocomposite includes a resin material with silicon oxide nanoparticles or silicon oxynitride nanoparticles, and the organic silicone resin includes one or more of polyalkyl organic silicone resin, polyaryl organic silicone resin and polyalkylaryl silicone resin.

In another aspect, the present disclosure provides in some embodiments a method for manufacturing a flexible substrate, including: forming an organic thin film on a base substrate; forming a first water-and-oxygen absorption adhesive layer on the organic thin film; forming an inorganic thin film on the first water-and-oxygen absorption adhesive layer; and forming a function layer on the inorganic thin film.

In some possible embodiments of the present disclosure, the forming the first water-and-oxygen absorption adhesive layer on the organic thin film includes: depositing a water-and-oxygen absorption material onto the organic thin film; patterning the water-and-oxygen absorption material to form an isolation area, thereby to acquire a water-and-oxygen absorption member; and depositing or spraying an adhesive at the isolation area of the water-and-oxygen absorption material member, so as to form the first water-and-oxygen absorption adhesive layer.

In some possible embodiments of the present disclosure, prior to depositing the water-and-oxygen absorption material onto the organic thin film, the method further includes subjecting a surface of the organic thin film proximate to the first water-and-oxygen absorption adhesive layer to plasma treatment.

In some possible embodiments of the present disclosure, the forming the function layer on the inorganic thin film includes: forming a TFT layer on the inorganic thin film; forming a second water-and-oxygen absorption adhesive layer on the TFT layer; and forming a planarization layer on the second water-and-oxygen absorption adhesive layer.

In yet another aspect, the present disclosure provides in some embodiments a display panel including the above-mentioned flexible substrate.

In some possible embodiments of the present disclosure, the display panel is an OLED display panel.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
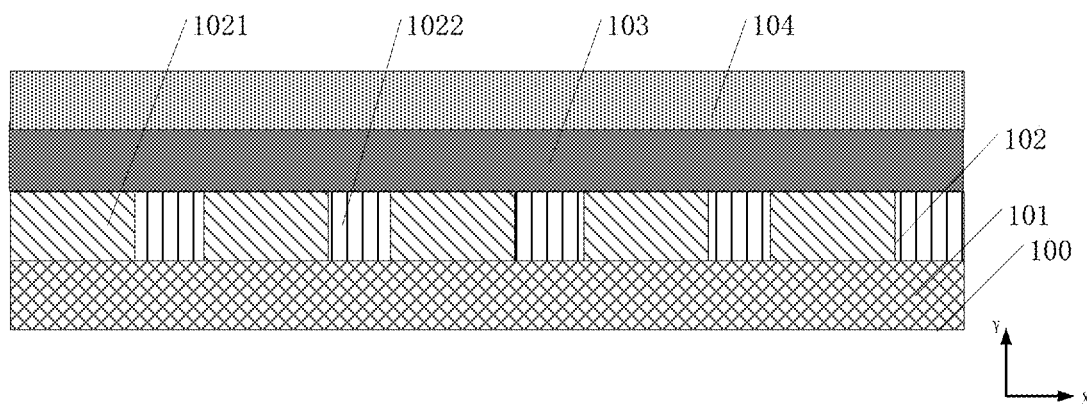
FIG. 1 is a schematic view showing a flexible substrate according to some embodiments of the present disclosure.

As shown in FIG. 1, the present disclosure provides in some embodiments a flexible substrate, which includes a base substrate 100, and an organic thin film 101, an inorganic thin film 103 and a function layer 104 laminated on the base substrate 100 (in a direction Y in FIG. 1). A first water-and-oxygen absorption adhesive layer 102 is arranged between, and adhered to respectively, the organic thin film 101 and the inorganic thin film 103.

In the embodiments of the present disclosure, the base substrate 100 may be a glass base substrate 100. During the formation of the organic thin film 101, an organic thin film material may be applied onto the glass base substrate 100 through a spin coating process, and then a subsequent array process may be performed, so as to remove the organic thin film 101 and any other film layer(s) on the organic thin film 101 off from the glass base substrate 100. In this regard, the formed flexible substrate has no glass base substrate, so as to ensure the foldability of the flexible substrate.

In the embodiments of the present disclosure, subsequent to the formation of the organic thin film 101, the organic thin film 101 may be subjected to plasma treatment, i.e., interaction between a gas and the flexible substrate may be excited through high-frequency coil discharging to increase surface energy, so as to increase an adhesion force between the organic thin film 101 and the first water-and-oxygen absorption adhesive layer 102. The organic thin film 101 may be made of a flexible organic material with a small elastic modulus, e.g., polyimide (PI), polycarbonate (PC) or polyether sulfone (PES). In some possible embodiments of the present disclosure, the organic thin film 101 may be made of PI. The inorganic thin film 103 may be made of silicon oxide or silicon nitride. In a possible embodiment of the present disclosure, the inorganic thin film 103 may be made of silicon oxide.

In the embodiments of the present disclosure, the first water-and-oxygen absorption adhesive layer 102 may be arranged between the organic thin film 101 and the inorganic thin film 103. Through the first water-and-oxygen absorption adhesive layer 102, it is able to effectively prevent the organic thin film 101 from being separated from the inorganic thin film 103 due to cracks at an interface therebetween, and prevent the lateral permeation of water and oxygen. In addition, it is able to overcome such drawbacks of the inorganic thin film 103 as large surface tension, being difficult to be wetted, large rigidity, high fragility, and being difficult to be adhered to the organic thin film 101.

Figure 2:
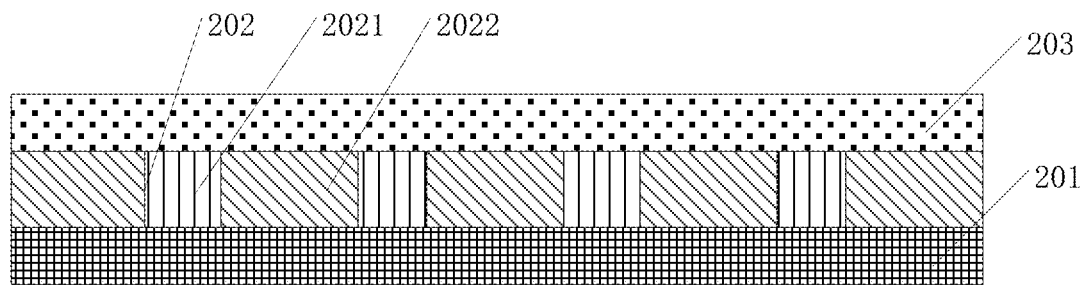
FIG. 2 is a partially schematic view showing the flexible substrate according to some embodiments of the present disclosure.

In some possible embodiments of the present disclosure, as shown in FIG. 2, the function layer may include a TFT layer 201 and a planarization layer 203 laminated one on another, and a second water-and-oxygen absorption adhesive layer 202 may be arranged between the TFT layer 201 and the planarization layer 203.

Figure 3:
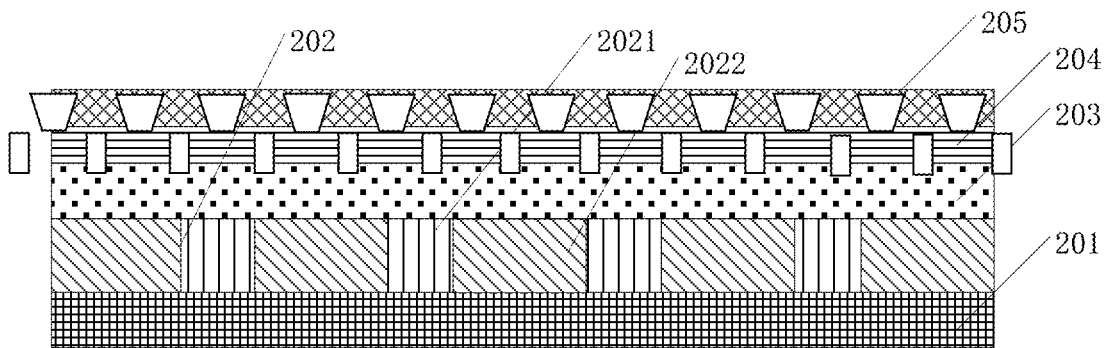
FIG. 3 is another schematic view showing the flexible substrate according to some embodiments of the present disclosure.

In the embodiments of the present disclosure, when the first water-and-oxygen absorption adhesive layer 102 is arranged between the organic thin film 101 and the inorganic thin film 103 of the flexible substrate, a thickness of the flexible substrate may increase, and the other function layers may be easily broken during the folding. Hence, the second water-and-oxygen absorption adhesive layer 202 may be arranged between the TFT layer 201 and the planarization layer 203, so as to prevent the other function layers from being broken during the folding. In some possible embodiments of the present disclosure, as shown in FIG. 3, an anode layer 204 and a pixel definition layer 205 may be arranged above the planarization layer 203, and through the second water-and-oxygen absorption adhesive layer 202, it is also able to prevent the oxidization of the anode layer 204 due to the permeation of the water and oxygen along the cracks, thereby to prevent the occurrence of a display defect. In a word, through the second water-and-oxygen absorption adhesive layer 202, it is able to prevent the occurrence of Growing Dark Spot (GDS) for a flexible display device and improve a service life of the flexible display device.

In some possible embodiments of the present disclosure, each of the first water-and-oxygen absorption adhesive layer 102 and the second water-and-oxygen absorption adhesive layer 202 may include water-and-oxygen absorption material members and adhesive members arranged alternately. As shown in FIG. 1, the water-and-oxygen absorption material members and the adhesive members may be arranged alternately in a direction X in FIG. 1. As shown in FIG. 1, the direction X may be a horizontal direction, a direction Y may be a vertical direction perpendicular to the direction X.

In some possible embodiments of the present disclosure, the water-and-oxygen absorption material member may be made of a water-and-oxygen absorption material, and the water-and-oxygen absorption material may be acquired through hybridization of an inorganic-organic composite.

In some possible embodiments of the present disclosure, the adhesive member may be made of an adhesive, and the adhesive may be made of a polymer-based inorganic nanocomposite or an organic silicone resin.

Figure 4:
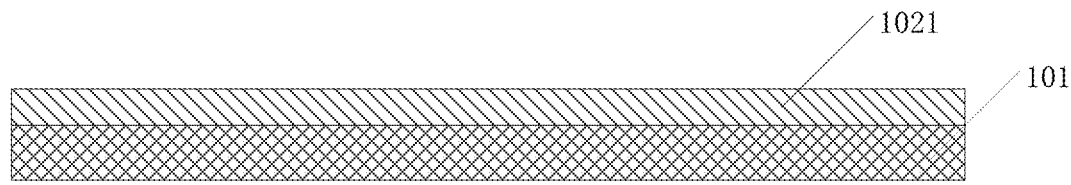
FIG. 4 is a schematic view showing a situation where a water-and-oxygen absorption material is deposited onto an organic thin film according to some embodiments of the present disclosure.
Figure 5:
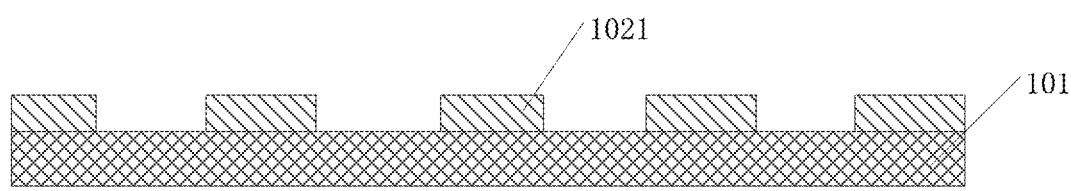
FIG. 5 is a schematic view showing a situation where the water-and-oxygen absorption material is etched to acquire a water-and-oxygen absorption material member according to some embodiments of the present disclosure.
Figure 6:
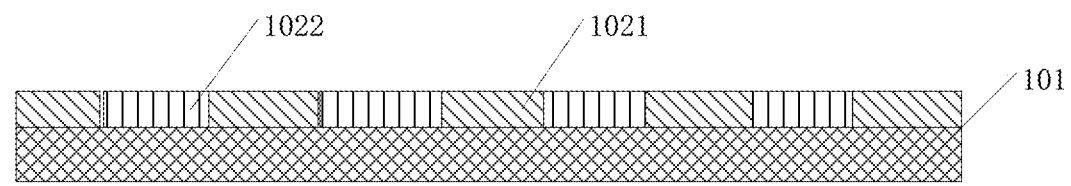
FIG. 6 is a schematic view showing a first water-and-oxygen absorption adhesive layer according to some embodiments of the present disclosure.

In the embodiments of the present disclosure, as shown in FIG. 4, the water-and-oxygen absorption material 1021 may be deposited onto the organic thin film 101 acquired after the plasma treatment through thermodynamic vapor deposition, and it may be acquired through hybridization of the inorganic-organic composite, so as to prevent the lateral and longitudinal permeation of the water and oxygen, and prevent the flexible substrate from being damaged due to the separation of the organic thin film from the inorganic thin film. Then, the water-and-oxygen absorption material 1021 may be etched to acquire each water-and-oxygen absorption material member 1021 as shown in FIG. 5. As shown in FIG. 6, an adhesive may be applied to the acquired water-and-oxygen absorption material member 1021 through ink-jet printing or thermal chemical deposition, so as to form the adhesive member 1022, thereby to prevent the organic thin film from being separated from the inorganic thin film, and increase the adhesion force between the organic thin film and the inorganic thin film. The adhesive member 1022 may be made of a polymer-based inorganic nanocomposite or an organic silicone resin. In some possible embodiments of the present disclosure, the polymer-based inorganic nanocomposite may include a resin material with silicon oxide nanoparticles or silicon oxynitride nanoparticles, and the organic silicone resin may include one or more of polyalkyl organic silicone resin, polyaryl organic silicone resin and polyalkylaryl silicone resin.

In some possible embodiments of the present disclosure, in the flexible substrate, a position of the water-and-oxygen absorption material member 1021 may be exchanged with a position of the adhesive member 1022 in FIG. 1 or FIG. 6. In the embodiments of the present disclosure, a position relationship between the water-and-oxygen absorption material member and the adhesive member as well as a ratio of a space occupied by the water-and-oxygen absorption material members to a space occupied by the adhesive members will not be particularly defined, as long as the water-and-oxygen absorption adhesive layer includes a water-and-oxygen absorption thin film (i.e., a water-and-oxygen absorption thin film member or the water-and-oxygen absorption material member).

In some possible embodiments of the present disclosure, as shown in FIG. 1, the ratio of the space occupied by the water-and-oxygen absorption material members 1021 to the space occupied by the adhesive members 1022 (i.e., a width ratio in the direction X) may be 2:1.

In some possible embodiments of the present disclosure, in the flexible substrate, shapes of each water-and-oxygen absorption material member 1021 and each adhesive member 1022 in FIG. 1 or FIG. 6 may be changed appropriately according to the practical need. For example, the shape of each of the water-and-oxygen absorption material member 1021 and the adhesive member 1022 in FIG. 1 or FIG. 6 may be a triangle, a diamond, a parallelogram or a trapezoid. In addition, in FIG. 1 or FIG. 6, the water-and-oxygen absorption material member 1021 may be flush with the adhesive member 1022, or one of them may be at a level higher than the other. It should be appreciated that, the corresponding designs or shapes may be set according to the actual requirements on the prevention of the lateral and longitudinal permeation of the water and oxygen as well as the enhancement of an adhesion effect.

In some possible embodiments of the present disclosure, the water-and-oxygen absorption material may include one or more of an acrylic resin hybridized with silicon dioxide, 1,4-butenediol hybridized with silicon dioxide, cis-butenedioic anhydride hybridized with silicon dioxide, and hydroxyl-terminated polybutadiene hybridized with silicon dioxide.

In the embodiments of the present disclosure, the water-and-oxygen absorption material may be acquired through hybridization of an inorganic-organic composite. Through the water-and-oxygen absorption material, it is able to prevent the lateral and longitudinal permeation of the water and oxygen, and prevent a back plate from being damaged due to the separation of the organic thin film from the inorganic thin film. The water-and-oxygen absorption material may include the inorganic-organic composite. It has a strong affinity with an organic material, and it may also be used to increase the affinity for the organic material and an inorganic material. In some possible embodiments of the present disclosure, the water-and-oxygen absorption material may include one or more of an acrylic resin, 1,4-butenediol, cis-butenedioic anhydride, and hydroxyl-terminated polybutadiene (HTPB) hybridized with silicon dioxide.

In some possible embodiments of the present disclosure, the polymer-based inorganic nanocomposite may include a resin material with silicon oxide nanoparticles or silicon oxynitride nanoparticles, and the organic silicone resin may include one or more of polyalkyl organic silicone resin, polyaryl organic silicone resin and polyalkylaryl silicone resin.

In the embodiments of the present disclosure, on one hand, the polymer-based inorganic nanocomposite has properties of a polymer adhesive, and on the other hand, the toughness, the mechanical property and the thermal property of the polymer-based nanocomposite are improved due to the addition of the inorganic nanocomposite. When a polymer material is modified with an inorganic nanometer material, the polymer-based inorganic nanocomposite may have features of both an organic material and an inorganic material, so it may serve as a transition layer between the inorganic material and the organic material, and may be used to increase an action force between the organic material and the inorganic material. In some possible embodiments of the present disclosure, the polymer-based inorganic nanocomposite may be prepared through adding $SiO_2/SiNO_x$ nanoparticles into acrylate, epoxy resin or acrylic resin using a solution co-blending method, and then deposited onto the flexible substrate through ink-jet printing, so as to achieve the transition between the inorganic material and the polymer, thereby to increase an action force between the flexible substrate and an inorganic waterproof layer.

The organic silicone resin may include a main chain Si—O—Si consisting of Si and O connected alternately, and a side chain consisting of Si and various organic radicals connected to Si, so it may have the properties of an organic material and an inorganic material. At a high temperature, a chemical bond between atoms is not broken easily, and a substance is not decomposed easily, so there is an excellent adhesion force between the organic silicon resin and the organic/inorganic material. In addition, there is a great degree of freedom between Si—O bonds, so it is able to increase a large spacing between molecules and reduce an intermolecular force, thereby to reduce interaction between the Si—O bonds as well as a surface tension. Hence, even at a low temperature, the organic silicone resin may still manifest an excellent physiochemical property, and thereby it may have excellent thermo-chemical stability. Furthermore, silicone resin is of a highly cross-linked net-like structure, and it is cooled naturally, an elastomer having high performance may be provided. The side chain contains the organic radial, so the organic silicone resin may have thermal deformability approaching to the organic material. In a word, the organic silicone resin is a perfect adhesive made of an organic material and an inorganic material.

According to the flexible substrate in the embodiments of the present disclosure, the first water-and-oxygen absorption adhesive layer may be arranged between, and connected to respectively, the organic thin film and the inorganic thin film, so as to overcome such drawbacks of the inorganic thin film as large surface tension, being difficult to be wetted, large rigidity, high fragility, and being difficult to be adhered to the organic thin film, thereby to prevent the organic thin film from being separated from the inorganic thin film due to cracks at an interface therebetween, and prevent the lateral permeation of the water and oxygen.

Figure 7:
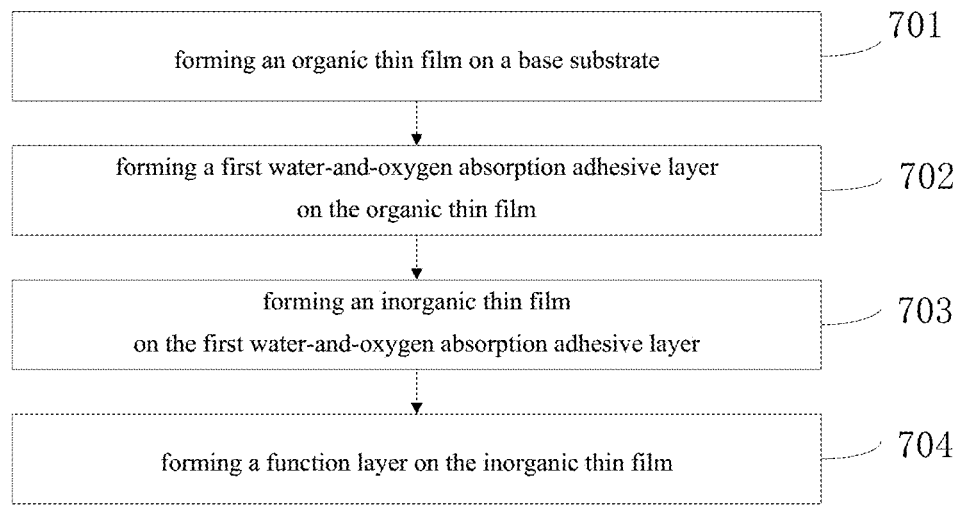
FIG. 7 is a flow chart of a method for manufacturing the flexible substrate according to some embodiments of the present disclosure.

As shown in FIG. 7, the present disclosure provides a method for manufacturing a flexible substrate, which includes: Step 701 of forming an organic thin film 101 on a base substrate 100; Step 702 of forming a first water-and-oxygen absorption adhesive layer 102 on the organic thin film 101; Step 703 of forming an inorganic thin film 103 on the first water-and-oxygen absorption adhesive layer 102; and Step 704 of forming a function layer 104 on the inorganic thin film 103.

In the embodiments of the present disclosure, prior to Step 701, a glass base substrate may be provided at first, and the organic thin film may be formed on the glass base substrate through spin coating. Next, a water-and-oxygen absorption material may be deposited onto the organic thin film through thermal chemical vapor deposition to form a water-and-oxygen absorption material member. The water-and-oxygen absorption material may be acquired through hybridization of an inorganic-organic composite, so as to prevent the lateral and longitudinal permeation of water and oxygen, and prevent a back plate from being damaged due to the separation of the organic thin film from the inorganic thin film. Next, the water-and-oxygen absorption material member may be etched, and an adhesive member made of a polymer-based inorganic nanocomposite or organic silicone resin may be formed on the etched water-and-oxygen absorption material member through ink-jet printing or thermal chemical deposition, so as to prevent the separation of the organic thin film from the inorganic thin film. The water-and-oxygen absorption material members and the adhesive members may be arranged alternately to form the first water-and-oxygen absorption adhesive layer, and then the inorganic thin film and the function layer may be formed on the first water-and-oxygen absorption adhesive layer.

According to the embodiments of the present disclosure, through the introduction of the water-and-oxygen absorption material member, it is able to prevent the lateral permeation of water and oxygen due to cracks at a periphery of the flexible substrate when the flexible substrate is cut. The water-and-oxygen absorption material may be added on the flexible substrate to prevent the lateral permeation of the water and oxygen at the cracks. In addition, the adhesive layer may be added between the organic thin film and the inorganic thin film so as to increase an adhesion force between the organic thin film and the inorganic thin film, thereby to prevent the flexible substrate from being damaged when the organic thin film is separated from the inorganic thin film.

Figure 8:
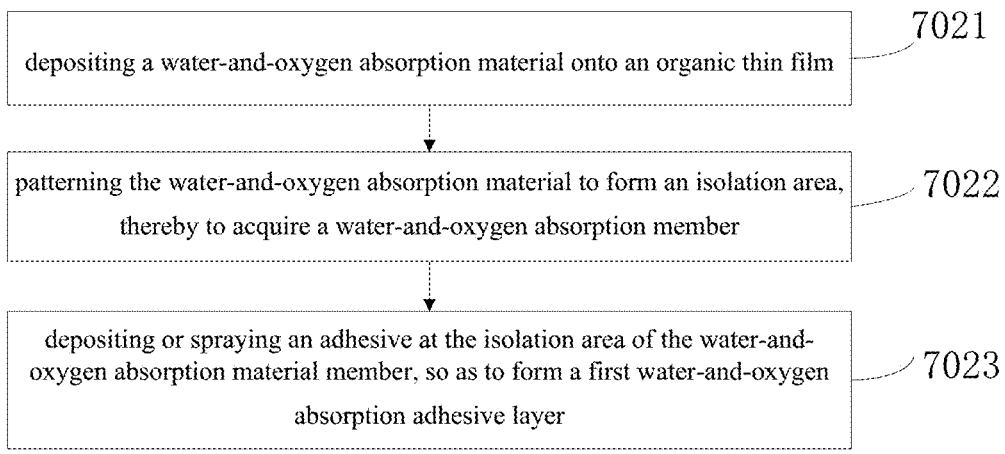
FIG. 8 is a specific flow chart of a sub-step of the method according to some embodiments of the present disclosure.

As shown in FIG. 8, Step 702 may include: Step 7021 of depositing the water-and-oxygen absorption material onto the organic thin film 101; Step 7022 of patterning the water-and-oxygen absorption material to form an isolation area, thereby to acquire the water-and-oxygen absorption material member; and Step 7023 of depositing or spraying an adhesive at the isolation area of the water-and-oxygen absorption material member to form the first water-and-oxygen absorption adhesive layer 102.

Figure 9:
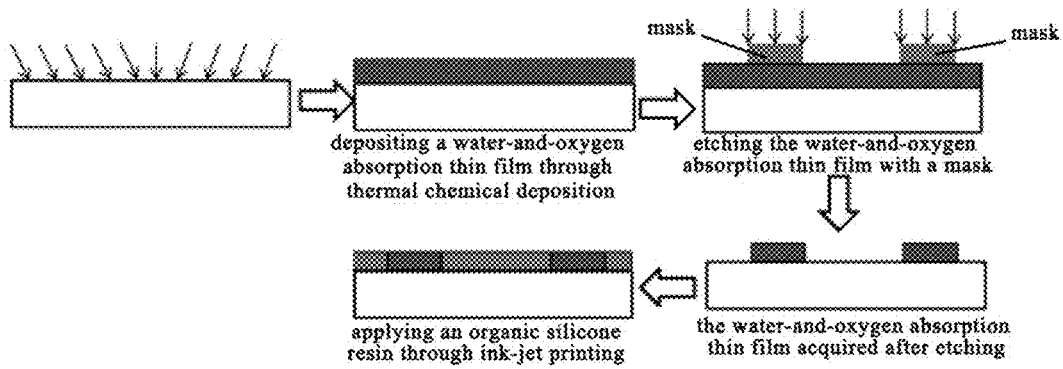
FIG. 9 is a schematic view showing the formation of a first water-and-oxygen absorption adhesive layer according to some embodiments of the present disclosure.

In the embodiments of the present disclosure, as shown in FIG. 9, prior to the deposition of the water-and-oxygen absorption material, the organic thin film may be subjected to plasma treatment, i.e., interaction between a gas and the flexible substrate may be excited through high-frequency coil discharging to increase surface energy, so as to increase an adhesion force between the organic thin film and the first water-and-oxygen absorption adhesive layer. Any other mode capable of increasing the surface energy may also be selected, which will not be particularly defined herein.

In some possible embodiments of the present disclosure, as shown in FIG. 9, the water-and-oxygen absorption material may be deposited onto the organic thin film through thermal chemical deposition to form the water-and-oxygen absorption thin film. The water-and-oxygen absorption material may also be deposited on the organic thin film in any other ways, which will not be particularly defined herein. The water-and-oxygen absorption material may be acquired through hybridization of an inorganic-organic composite. Through the water-and-oxygen absorption material, it is able to prevent the lateral and longitudinal permeation of the water and oxygen, and prevent a back plate from being damaged due to the separation of the organic thin film from the inorganic thin film. The water-and-oxygen absorption material may mainly include the inorganic-organic composite. It has a strong affinity with an organic material, and it may also be used to increase the affinity for the organic material and an inorganic material. The water-and-oxygen absorption material may mainly include one or more of an acrylic resin, 1,4-butenediol, cis-butenedioic anhydride, and hydroxyl-terminated polybutadiene (HTPB) hybridized with silicon dioxide. Next, the water-and-oxygen absorption thin film may be etched with a mask plate to acquire the water-and-oxygen absorption thin film structure in FIG. 5. An adhesive made of a polymer-based inorganic nanocomposite or organic silicone resin may be applied onto the etched water-and-oxygen absorption thin film through ink-jet printing or thermal chemical deposition, so as to form the adhesive member. Through the adhesive member, it is able to prevent the organic thin film from being separated from the inorganic thin film, and increase an adhesion force between the organic thin film and the inorganic thin film. The polymer-based inorganic nanocomposite may include a resin material with silicon oxide nanoparticles or silicon oxynitride nanoparticles, and the organic silicone resin may include one or more of polyalkyl organic silicone resin, polyaryl organic silicone resin and polyalkylaryl silicone resin. As shown in FIG. 9, the water-and-oxygen absorption thin films and the adhesive members may be arranged alternately to form the first water-and-oxygen absorption adhesive layer.

Figure 10:
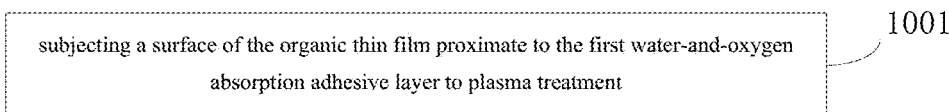
FIG. 10 is a specific flow chart of a step of subjecting an organic thin film to plasma treatment according to some embodiments of the present disclosure.

In some possible embodiments of the present disclosure, as shown in FIG. 10, prior to depositing the water-andoxygen absorption material on the organic thin film 101 through thermal chemical vapor deposition, the method may further include Step 1001 of subjecting a surface of the organic thin film 101 proximate to the first water-and-oxygen absorption adhesive layer 102 to plasma treatment.

In the embodiments of the present disclosure, using the plasma treatment, interaction between a gas and the flexible substrate may be excited through high-frequency coil discharging to increase surface energy, so as to increase an adhesion force between the flexible substrate and the first water-and-oxygen absorption adhesive layer 102.

Figure 11:
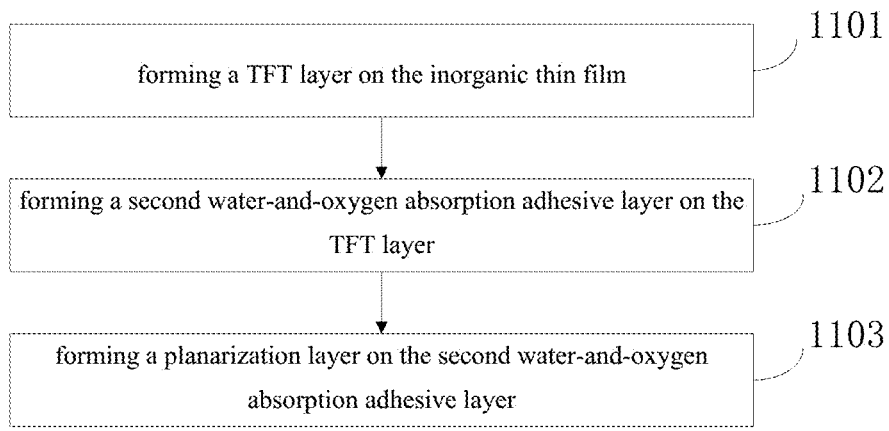
FIG. 11 is a specific flow chart of a sub-step of the method according to some embodiments of the present disclosure.

In some possible embodiments of the present disclosure, as shown in FIG. 11, the forming the function layer on the inorganic thin film 103 may include: Step 1101 of forming a TFT layer on the inorganic thin film 103; Step 1102 of forming a second water-and-oxygen absorption adhesive layer 202 on the TFT layer; and Step 1103 of forming a planarization layer 293 on the second water-and-oxygen absorption adhesive layer 202.

In the embodiments of the present disclosure, the TFT layer may be deposited on the inorganic thin film. A method for forming the second water-and-oxygen absorption adhesive layer on the TFT layer through chemical deposition may be the same as a method for forming the first water-and-oxygen absorption adhesive layer on the organic thin film, i.e., the water-and-oxygen absorption material may be deposited on the TFT layer through thermal chemical deposition to form the water-and-oxygen absorption thin film. Of course, the water-and-oxygen absorption material may also be deposited on the TFT layer in any other ways, which will not be particularly defined herein. The water-and-oxygen absorption material may be acquired through hybridization of the inorganic-organic composite, so as to prevent the lateral and longitudinal permeation of the water and oxygen, and prevent a back plate from being damaged due to the separation of the organic thin film from the inorganic thin film. The water-and-oxygen absorption material may mainly include the inorganic-organic composite. It has a strong affinity with an organic material, and it may also be used to increase the affinity for the organic material and an inorganic material. The water-and-oxygen absorption material may mainly include one or more of an acrylic resin, 1,4-butenediol, cis-butenedioic anhydride, and hydroxyl-terminated polybutadiene (HTPB) hybridized with silicon dioxide. Next, the water-and-oxygen absorption thin film may be etched with a mask plate to acquire the water-and-oxygen absorption thin film structure in FIG. 5. An adhesive made of a polymer-based inorganic nanocomposite or organic silicone resin may be applied onto the etched water-and-oxygen absorption thin film through ink-jet printing or thermal chemical deposition, so as to form the adhesive member. Through the adhesive member, it is able to prevent the organic thin film from being separated from the inorganic thin film, and increase an adhesion force between the organic thin film and the inorganic thin film. The polymer-based inorganic nanocomposite may include a resin material with silicon oxide nanoparticles or silicon oxynitride nanoparticles, and the organic silicone resin may include one or more of polyalkyl organic silicone resin, polyaryl organic silicone resin and polyalkylaryl silicone resin. As shown in FIG. 9, the water-and-oxygen absorption thin films and the adhesive members may be arranged alternately to form the second water-and-oxygen absorption adhesive layer. Then, the planarization layer may be formed at a surface of the second water-and-oxygen absorption adhesive layer. In some possible embodiments of the present disclosure, an anode layer and a pixel definition layer may be formed sequentially on the planarization layer. Through the second water-and-oxygen absorption adhesive layer, it is able to prevent the oxidization of an anode due to the permeation of the water and oxygen along the cracks, and prevent the occurrence of a display defect, thereby to prevent the occurrence of GDS for a flexible display device and improve a service life of the flexible display device.

According to the method for manufacturing the flexible substrate in the embodiments of the present disclosure, the first water-and-oxygen absorption adhesive layer may be arranged between, and connected to, the organic thin film and the inorganic thin film, so as to overcome such drawbacks of the inorganic thin film as large surface tension, being difficult to be wetted, large rigidity, high fragility, and being difficult to be adhered to the organic thin film, thereby to prevent the organic thin film from being separated from the inorganic thin film due to cracks at an interface therebetween, and prevent the lateral permeation of the water and oxygen.

The present disclosure further provides in some embodiments a display panel including a flexible substrate. The flexible substrate may include a base substrate, and an organic thin film, an inorganic thin film and a function layer laminated on the base substrate. A first water-and-oxygen absorption adhesive layer may be arranged between, and adhered to respectively, the organic thin film and the inorganic thin film.

In some possible embodiments of the present disclosure, the function layer may include a TFT layer and a planarization layer laminated one on another, and a second water-and-oxygen absorption adhesive layer may be arranged between the TFT layer and the planarization layer.

In some possible embodiments of the present disclosure, each of the first water-and-oxygen absorption adhesive layer and the second water-and-oxygen absorption adhesive layer may include water-and-oxygen absorption material members and adhesive members arranged alternately in a direction perpendicular to a lamination direction.

In some possible embodiments of the present disclosure, each water-and-oxygen absorption material member is made of a water-and-oxygen absorption material, and the water-and-oxygen absorption material is acquired through hybridization of an inorganic-organic composite.

In some possible embodiments of the present disclosure, each adhesive member is made of an adhesive, and the adhesive is made of a polymer-based inorganic nanocomposite or an organic silicone resin.

In some possible embodiments of the present disclosure, the water-and-oxygen absorption material includes one or more of an acrylic resin hybridized with silicon dioxide, 1,4-butenediol hybridized with silicon dioxide, cis-butenedioic anhydride hybridized with silicon dioxide, and hydroxyl-terminated polybutadiene hybridized with silicon dioxide.

In some possible embodiments of the present disclosure, the polymer-based inorganic nanocomposite includes a resin material with silicon oxide nanoparticles or silicon oxynitride nanoparticles, and the organic silicone resin includes one or more of polyalkyl organic silicone resin, polyaryl organic silicone resin and polyalkylaryl silicone resin.

According to the display panel in the embodiments of the present disclosure, the first water-and-oxygen absorption adhesive layer may be arranged between, and connected to respectively, the organic thin film and the inorganic thin film, so as to overcome such drawbacks of the inorganic thin film as large surface tension, being difficult to be wetted, large rigidity, high fragility, and being difficult to be adhered to the organic thin film, thereby to prevent the organic thin film from being separated from the inorganic thin film due to cracks at an interface therebetween, and prevent the lateral permeation of the water and oxygen.

For ease of description, the above-mentioned method has been described on the basis of a series of steps, and it should be appreciated that, these steps may also be performed in any other order or simultaneously. In addition, the above embodiments are for illustrative purposes only, and the steps and modules involved therein are not always necessary.

The above embodiments have been described in a progressive manner, and the same or similar contents in the embodiments will not be repeated, i.e., each embodiment merely focuses on the difference from the others.

It should be further appreciated that, such words as "first" and "second" are merely used to separate one entity or operation from another entity or operation, but are not necessarily used to represent or imply any relation or order between the entities or operations. In addition, such terms as "include" or "including" or any other variations involved in the present disclosure intend to provide non-exclusive coverage, so that a procedure, method, article or device including a series of elements may also include any other elements not listed herein, or may include any inherent elements of the procedure, method, article or device. If without any further limitations, for the elements defined by such sentence as "including one . . . ", it is not excluded that the procedure, method, article or device including the elements may also include any other identical elements.

The flexible substrate, its manufacturing method and the display panel have been described hereinabove in details. The principle and the implementation of the present disclosure has been set forth with reference to the embodiments, and these embodiments are merely used to facilitate the understanding of the method and the core concept of the present disclosure. Based on the concept of the present disclosure, a person skilled in the art may make further modifications without departing from the spirit of the present disclosure. In a word, the contents in the specification shall not be construed as limiting the scope of the present disclosure.

What is claimed is:

1. A flexible substrate, comprising:
    a base substrate;
    an organic thin film, an inorganic thin film and a function layer laminated on the base substrate; and
    a first water-and-oxygen absorption adhesive layer arranged between the organic thin film and the inorganic thin film and adhered to the organic thin film and the inorganic thin film respectively,
    wherein the function layer comprises a thin film transistor (TFT) layer and a planarization layer laminated one on another, and a second water-and-oxygen absorption adhesive layer is arranged between the TFT layer and the planarization layer.

2. The flexible substrate according to claim 1, wherein the first water-and-oxygen absorption adhesive layer comprises water-and-oxygen absorption material members and adhesive members arranged alternately in a direction perpendicular to a lamination direction.

3. The flexible substrate according to claim 1, wherein the second water-and-oxygen absorption adhesive layer comprises water-and-oxygen absorption material members and adhesive members arranged alternately in a direction perpendicular to a lamination direction.

4. The flexible substrate according to claim 2, wherein a ratio of a space occupied by the water-and-oxygen absorption material members to a space occupied by the adhesive members is 2:1.

5. The flexible substrate according to claim 2, wherein each water-and-oxygen absorption material member is made of a water-and-oxygen absorption material, and the water-and-oxygen absorption material is acquired through hybridization of an inorganic-organic composite.

6. The flexible substrate according to claim 2, wherein each adhesive member is made of an adhesive, and the adhesive is made of a polymer-based inorganic nanocomposite or an organic silicone resin.

7. The flexible substrate according to claim 5, wherein the water-and-oxygen absorption material comprises one or more of an acrylic resin hybridized with silicon dioxide, 1,4-butenediol hybridized with silicon dioxide, cis-butenedioic anhydride hybridized with silicon dioxide, and hydroxyl-terminated polybutadiene hybridized with silicon dioxide.

8. The flexible substrate according to claim 6, wherein the polymer-based inorganic nanocomposite comprises a resin material with silicon oxide nanoparticles or silicon oxynitride nanoparticles, and the organic silicone resin comprises one or more of polyalkyl organic silicone resin, polyaryl organic silicone resin and polyalkylaryl silicone resin.

9. A method for manufacturing a flexible substrate, comprising:
    forming an organic thin film on a base substrate;
    forming a first water-and-oxygen absorption adhesive layer on the organic thin film;
    forming an inorganic thin film on the first water-and-oxygen absorption adhesive layer; and
    forming a function layer on the inorganic thin film,
    wherein the forming the function layer on the inorganic thin film comprises:
        forming a TFT layer on the inorganic thin film;
        forming a second water-and-oxygen absorption adhesive layer on the TFT layer; and
        forming a planarization layer on the second water-and-oxygen absorption adhesive layer.

10. The method according to claim 9, wherein the forming the first water-and-oxygen absorption adhesive layer on the organic thin film comprises:
    depositing a water-and-oxygen absorption material onto the organic thin film;
    patterning the water-and-oxygen absorption material to form an isolation area, thereby to acquire a water-and-oxygen absorption member; and
    depositing or spraying an adhesive at the isolation area of the water-and-oxygen absorption material member, so as to form the first water-and-oxygen absorption adhesive layer.

11. The method according to claim 10, wherein prior to depositing the water-and-oxygen absorption material onto the organic thin film, the method further comprises:
    subjecting a surface of the organic thin film proximate to the first water-and-oxygen absorption adhesive layer to plasma treatment.

12. A display panel, comprising a flexible substrate, the flexible substrate comprising:
    a base substrate;
    an organic thin film, an inorganic thin film and a function layer laminated on the base substrate; and
    a first water-and-oxygen absorption adhesive layer arranged between the organic thin film and the inorganic thin film and adhered to the organic thin film and the inorganic thin film respectively, wherein the function layer comprises a thin film transistor (TFT) layer and a planarization layer laminated one on another, and a second water-and-oxygen absorption adhesive layer is arranged between the TFT layer and the planarization layer.

13. The display panel according to claim 12, wherein the display panel is an Organic Light-Emitting Diode (OLED) display panel.

14. The flexible substrate according to claim 2, wherein the second water-and-oxygen absorption adhesive layer comprises water-and-oxygen absorption material members and adhesive members arranged alternately in a direction perpendicular to a lamination direction.

15. The flexible substrate according to claim 3, wherein a ratio of a space occupied by the water-and-oxygen absorption material members to a space occupied by the adhesive members is 2:1.

16. The flexible substrate according to claim 3, wherein each water-and-oxygen absorption material member is made of a water-and-oxygen absorption material, and the water-and-oxygen absorption material is acquired through hybridization of an inorganic-organic composite.

17. The flexible substrate according to claim 3, wherein each adhesive member is made of an adhesive, and the adhesive is made of a polymer-based inorganic nanocomposite or an organic silicone resin.

* * * * *

UNITED STATES PATENT AND TRADEMARK OFFICE
CERTIFICATE OF CORRECTION

PATENT NO. : 11,329,111 B2  
APPLICATION NO. : 16/959337  
DATED : May 10, 2022  
INVENTOR(S) : Zhaowei Yu et al.

Page 1 of 1

It is certified that error appears in the above-identified patent and that said Letters Patent is hereby corrected as shown below:

On the Title Page

Change:
"(73) Assignee: BOE TECHNOLOGY GROUP CO., LTD., Beijing (CN)"

To:
--(73) Assignees: CHENGDU BOE OPTOELECTRONICS TECHNOLOGY CO., LTD.; Sichuan (CN); BOE TECHNOLOGY GROUP CO., LTD., Beijing (CN)--

Signed and Sealed this  
Fifteenth Day of August, 2023

Katherine Kelly Vidal  
*Director of the United States Patent and Trademark Office*